(12) United States Patent
Okhmatovski et al.

(10) Patent No.: US 8,731,877 B2
(45) Date of Patent: May 20, 2014

(54) METHOD AND APPARATUS FOR BROADBAND MODELING OF CURRENT FLOW IN THREE-DIMENSIONAL WIRES OF INTEGRATED CIRCUITS

(76) Inventors: Vladimir Okhmatovski, Winnipeg (CA); Mohammed A. I. Al-Qedra, Winnipeg (CA)

( * ) Notice: Subject to any disclaimer, the term of this patent is extended or adjusted under 35 U.S.C. 154(b) by 772 days.

(21) Appl. No.: 12/936,017

(22) PCT Filed: Apr. 1, 2009

(86) PCT No.: PCT/CA2009/000378
§ 371 (c)(1),
(2), (4) Date: Oct. 1, 2010

(87) PCT Pub. No.: WO2009/121167
PCT Pub. Date: Oct. 8, 2009

(65) Prior Publication Data
US 2011/0029295 A1 Feb. 3, 2011

Related U.S. Application Data

(60) Provisional application No. 61/041,262, filed on Apr. 1, 2008.

(51) Int. Cl.
*G06F 17/10* (2006.01)
*G06F 17/50* (2006.01)
*H01B 1/00* (2006.01)

(52) U.S. Cl.
CPC ........ *G06F 17/5036* (2013.01); *G06F 17/5018* (2013.01); *H01B 1/00* (2013.01)
USPC .............................................................. 703/2

(58) Field of Classification Search
CPC . G06F 17/50; G06F 17/5036; G06F 17/5018; H01B 1/00; H01B 1/02; H01B 1/023; H01B 1/026; H01B 1/16; H01B 5/00

USPC .................................................. 703/2, 14, 13
See application file for complete search history.

(56) References Cited

PUBLICATIONS

Tsuk, M.J.; Kong, Jin-Au, "A hybrid method for the calculation of the resistance and inductance of transmission lines with arbitrary cross sections," Microwave Theory and Techniques, IEEE Transactions on , vol. 39, No. 8, pp. 1338,1347, Aug 1991.*
Ben Song, Zhenhai Zhu, John D. Rockway, and Jacob White. 2003. A New Surface Integral Formulation for Wideband Impedance Extraction of 3-D Structures. In Proceedings of the 2003 IEEE/ACM international conference on Computer-aided design (ICCAD '03). IEEE Computer Society, Washington, DC, USA, 843-.*

* cited by examiner

*Primary Examiner* — Kamini S Shah
*Assistant Examiner* — Luke Osborne
(74) *Attorney, Agent, or Firm* — Ryan W. Dupuis; Kyle R. Satterthwaite; Ade & Company Inc.

(57) ABSTRACT

A new surface impedance model for extraction in lossy two-dimensional (2D) interconnects of rectangular cross-section is presented. The model is derived directly from the volumetric electric field integral equation (EFiE) under the approximation of the unknown volumetric current density as a product of the exponential factor describing the skin-effect and the unknown surface current density on the conductor's periphery. By proper accounting for the coupling between the boundary elements situated on the top and bottom surfaces of conductor with the elements located on the side-walls, the model maintains accuracy from DC to multi-GHz frequencies as well as for conductors with both large and small thickness/width ratios. A generalization of the full-periphery surface impedance model to the three-dimensional electric field integral equation is also described.

21 Claims, 5 Drawing Sheets

METHOD AND APPARATUS FOR BROADBAND MODELING OF CURRENT FLOW IN THREE-DIMENSIONAL WIRES OF INTEGRATED CIRCUITS

This application claims the benefit under 35 U.S.C. 119(e) of U.S. provisional application Ser. No. 61/041,262, filed Apr. 1, 2008.

FIELD OF THE INVENTION

The present invention relates to a method of modelling surface impedance of a conductor having a current flow, and furthermore relates to a resulting surface impedance model and its implementation using a suitable method of moment discretization scheme. The surface impedance model is derived directly from the volumetric electric field integral equation under the approximation of the unknown volumetric current density as a product of the exponential factor describing the skin-effect and the unknown surface current density on the conductor's periphery.

BACKGROUND

Rigorous and efficient electromagnetic modeling of interconnects can be achieved through incorporation of appropriate surface impedance models into the boundary-element discretization techniques such as MoM. To be useful the model must be accurate in the broad range of frequencies spanning from DC to tens of GHz, applicable to the conductor cross-sections with both small and large thickness-to-width ratios, computationally efficient, and also easy to retrofit into existing MoM solvers.

A variety of surface impedance models have been proposed in the past as described in the following documents:
1. J. D. Morsey, et. al., "Finite-Thickness Conductor Models for Full-Wave Analysis of Interconnects With a Fast Integral Equation Method," *IEEE Trans. on Advanced Packaging*, vol. 27, no. I, pp. 24-33, February 2004.
2. J. Rautio, et al., "Microstrip Conductor Loss Models for Electromagnetic Analysis," *IEEE Trans. on Microwave Theory Tech.*, vol. 51, no. 3, pp. 915-921, March 2003.
3. F. Ling, et. al., "Large-Scale Broad-Band Parasitic Extraction for Fast Layout Verification of 3-D RF and Mixed-Signal On-Chip Structures," *IEEE Trans. Microwave Theory Tech.*, vol. 53, no. 1, pp. 264-273, January 2005.
4. A. W. Glisson, "Electromagnetic scattering by arbitrarily shaped surfaces with impedance boundary conditions," *Radio Science, vol. 27, no. 6, pp. 935-943, November-December 1992,*

The above mentioned requirements have not been satisfactorily met thus far by the above noted documents and this consequently motivates the on-going quest for more efficient and accurate models.

Other prior art references relevant to the present invention include the following.
5. C. R. Paul, *Analysis of Mulliconduclor Transmission Lines*, Ch. 3, John Wiley & Sons, Inc., Toronto, CA, 1994.
6. D. DeZutter, et al., "Skin Effect Modeling Based on a Differential Surface Admittance Operator," *IEEE Trans. Microwave Theory Tech.*, vol. 53, no. 8, pp. 2526-2538, August. 2005.
7. S. M. Rao, D. R. Wilton, and A. W. Glisson, "Electromagnetic scattering by surfaces of arbitrary shapes," *IEEE Trans. Antennas Propag., Vol.* 30, pp. 409-418, May 1982.
8. K. A. Michalski and D. Zheng, "Electromagnetic scattering and radiation by surfaces of arbitrary shape in layered media, Part I: Theory," *IEEE Trans. Antennas Propag.*, Vol. 38, pp. 335-344, March 1990.

Any documents referred to in the accompanying specification are hereby incorporated by reference.

SUMMARY OF THE INVENTION

In this document a surface impedance model is derived as a result of volumetric electric field integral equation (EFIE) reduction to the surface EFIE, via approximation of the unknown cross-sectional volumetric current as a product of the exponential factor describing the skin-effect and the surface current density on the periphery of the conductor. Thus, the derived surface EFIE allows for both the flexibility in current variation on the conductor's surface, which is essential for adequate capturing of the proximity effects, and the proper exponential attenuation of the current inside of the conductor, which is critical for accurate skin-effect description. The numerically extracted per-unit-length (p.u.l) resistance and inductance matrices demonstrate the model to be accurate in a wide range of frequencies, as well as for both large and small thickness-to-width cross-sectional aspect ratios.

According to one aspect of the invention there is provided a method of modelling surface impedance of a conductor having a current flow, the method comprising:

formulating a volumetric electric field integral equation with respect to an unknown volumetric current density of the current flow in the conductor;

representing the unknown volumetric current density in the volumetric electric field integral equation as a product of a current density of a peripheral surface of the conductor and an exponential factor describing a cross-sectional distribution of the current according to skin effect;

adopting an approximation of Green's function across a cross-section of the conductor; and reducing the volumetric electric field integral equation including the unknown volumetric current density representation to a surface integral equation using the approximation of Green's function.

The method preferably includes adopting an approximation of Green's function by fixing Green's function across the cross-section of the conductor.

The method is suitable for conductors having either a rectangular cross-section or a polygonal, non-rectangular cross-section.

The volumetric electric field integral equation is preferably formulated with respect to the unknown volumetric current density $j_z$ in a cross-section of the conductor due to a vector of excitation $V_{p.u.l.}$ by enforcing Ohm's law $E_z(\rho) = \sigma^{-1} j_z(\rho)$ inside the conductor ($\rho \in S$) as follows:

$$\sigma^{-1} j_z(\rho) + i\omega\mu_0 \int_S G(\rho \mid \rho') j_z(\rho') dS' = -V_{p.u.l.}(\rho).$$

For a conductor which extends in a z-direction and has a rectangular cross-section, the method preferably includes approximating the unknown volumetric current density, represented as $j_z$, across the conductor according to skin-effect of a plane-wave incident on a conducting plane with infinite extension as follows:

$$j_z(\rho) \cong \frac{ik_\sigma(J_z^t(y)e^{-ik_\sigma(X-x)} + J_z^b(y)e^{-ik_\sigma x})}{1 - e^{-ik_\sigma X}} + \frac{ik_\sigma(J_z^l(x)e^{-ik_\sigma y} + J_z^r(x)e^{-ik_\sigma(Y-y)})}{1 - e^{-ik_\sigma Y}}$$

where $J_z^t(y)$, $J_z^b(y)$, $J_z^l(x)$, $J_z^r(x)$, are unknown surface current densities at points of radius-vector $\rho$ projections onto respective top, bottom, left, and right walls of the conductor.

Reducing the volumetric electric field integral equation to a surface electric field integral equation with respect to the current density of the peripheral surface of the conductor is preferably accomplished by restricting an observation point ρ to a periphery of the conductor as follows:

$$Z^{\sigma}\{J_z(\rho)\} + i\omega\mu_0 \int_C G(\rho\mid\rho')J_z(\rho')dc' = -V_{p.u.l.}(\rho)$$

The method preferably further includes combining the unknown surface current densities over the top, bottom, left and right sides and evaluating integrals thereof over a conductor thickness T and conductor width W as follows:

$$\int_V \overline{G}_A(r,r') \cdot j(r')dv' \cong \int_S \overline{G}_A(r,r') \cdot J(r')ds'.$$

The volumetric electric field integral equation may be formulated with respect to the unknown volumetric current density of the current flow in the conductor for current flows along more than one axis for three dimensional current flows.

The unknown volumetric current density may be related to unknown surface current densities for each surface of the conductor in which each unknown surface current density is represented as a multidimensional vector.

The method may further include reducing the volumetric electric field integral equation to the surface integral equation in which a tangential electrical field at any point on a surface of the conductor is related to a surface current density at corresponding points on all segments of a cross-sectional periphery of the conductor and/or the tangential electrical field at any point on a surface of the conductor is related to a tangential magnetic field at corresponding points on all segments of a cross-sectional periphery of the conductor.

According to a second aspect of the present invention there is provided a surface impedance model for a conductor having a current flow, the model comprising:

a surface electric field integral equation resulting from a reduction of a volumetric electric field integral equation in which an unknown cross-sectional volumetric current of the volumetric electric field integral equation is approximated as a product of an exponential factor describing a cross-sectional distribution of the current according to skin effect and a current density on a peripheral surface of the conductor.

According to a further aspect of the present invention there is provided a method of implementing a surface impedance model of a conductor comprising a surface electric field integral equation including a surface impedance term and an integral term resulting from a reduction of a volumetric electric field integral equation in which an unknown cross-sectional volumetric current of the volumetric electric field integral equation is approximated as a product of an exponential factor describing a cross-sectional distribution of the current according to skin effect and a current density on a peripheral surface of the conductor, the method including:

discretizing the surface electric field integral equation of a periphery of the conductor into a discrete form comprising a sum of a sparse matrix corresponding to the surface impedance term of the surface electric field integral equation and a dense matrix corresponding to the integral term of the surface electric field integral equation; and identifying for each discrete element of the discrete form, other discrete elements which are related via the surface impedance model.

Preferably the method comprises using the surface impedance model in conjunction with a suitable method of moment discretization scheme.

The dense matrix may be represented as follows:

$$Z_{mn}^A = i\omega\mu_0 \int_{\Delta C_n} G(\rho_m\mid\rho')dc'.$$

According to the present invention as described herein, a simple and effective surface impedance model suitable for RL-extraction in 2D interconnects of rectangular cross-section with both small and large thickness/width ratio is demonstrated. The model maintains accuracy from DC to multi-GHz frequencies due to properly captured skin-effect current attenuation off the conductor cross-sectional periphery. The extension of the proposed model to 3D Rao-Wilton-Glisson MoM discretization of EFIE is also demonstrated.

Some embodiments of the invention will now be described in conjunction with the accompanying drawings in which:

BRIEF DESCRIPTION OF THE DRAWINGS

FIG. 1 (a) is a schematic representation of an interconnect geometry relating to the volumetric current density distribution across the conductor approximated according to skin effect.

FIG. 1 (b) is a schematic representation of the interconnect of FIG. 1 (a) discretized with N=14 piece-wise basis functions.

FIG. 1 (c) is a schematic representation of additional matrix fillings due to the application of a full-peripheral $Z_s$ model according to the present invention.

In the drawings like characters of reference indicate corresponding parts in the different figures.

DETAILED DESCRIPTION

Figure 1:
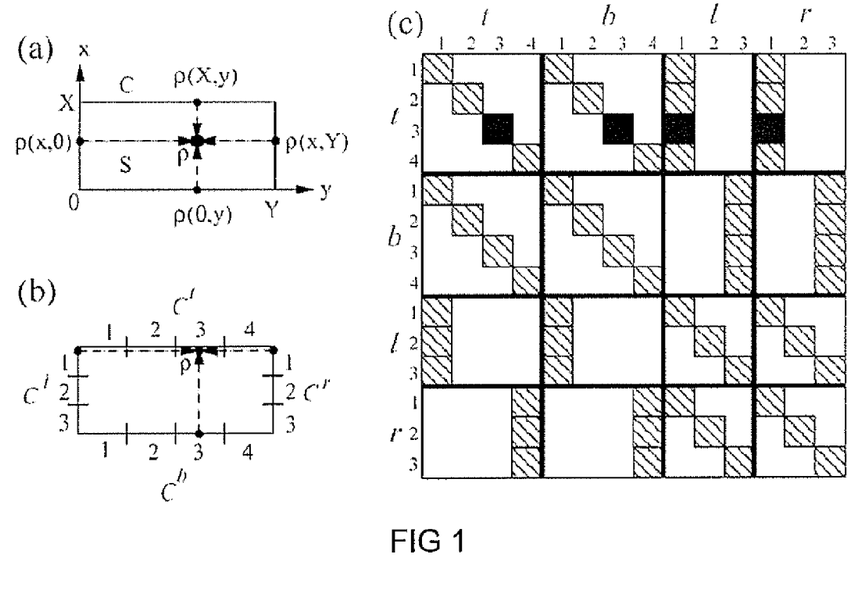

The formulation of a surface impedance model as described herein initially considers a generic 2-D interconnect structure of cross-section S and conductivity σ situated in homogeneous nonmagnetic medium of complex relative permittivity $\hat{\in} = \in + \sigma/(i\omega\in)$ where ω represents the angular frequency and $i=\sqrt{-1}$. The interconnect is made up of a very good conducting material (i.e. $\sigma \gg \omega\in$). Assuming the current flow in the z-direction, we relate the electric field $E_z$ to volumetric current density $j_z$ through the vector potential $A_z$ as follows:

$$E_z(\rho) = -i\omega A_z(\rho) - \frac{d\phi(\rho)}{dz} \tag{1}$$

where $\Phi$ is the scalar potential, and $\rho=x\hat{x}+y\hat{y}$ is the 2-D position vector depicted in the coordinate system $\rho(t,w)$, as shown in FIG. 1(a) and $\hat{z}=\hat{x}\times\hat{y}$, and $$A_z(\rho) = \mu_0 \int_S G(\rho \mid \rho')j_z(\rho')dS' \quad (2)$$

In equation (2), G is the two-dimensional free-space quasi-static Green's function $$G(\rho|\rho')=G(x,y|x',y')=-1/(2\pi)\ln(|\rho-\rho'|) \quad (3)$$

where the logarithmic nature of the Green's function is obtained due to considering only the dominant conduction current $\sigma E_z$ and dropping off the negligible displacement current $\omega \in E_z$. The volumetric EFIE with respect to unknown current $j_z$ in the conductor cross-section due to per-unit-length excitation follows from Ohm's law $E_z(\rho)=\sigma^{-1}j_z(\rho)$ enforced inside the conductor ($\rho \in S$)

$$\sigma^{-1}j_z(\rho) + i\omega\mu_0 \int_S G(\rho \mid \rho')j_z(\rho')dS' = -V_{p.u.l.}(\rho) \quad (4)$$

The boundary-element method such as MoM seeks to decrease the computational complexity of the numerical solution in volumetric EFIE (4) through its reduction to a surface EFIE where the unknown function is the current distribution $J_z(\rho)$ on the conductor surface $\rho \in \partial S$. In order to perform such reduction let us consider a rectangular cross-section wire with focal coordinate system shown in FIG. 1(a). The sought volumetric current density $J_z$ distribution across the conductor can be approximated according to skin-effect as follows:

$$j_z(\rho) \cong \frac{ik_\sigma(J_z^t(y)e^{-ik_\sigma(X-x)} + J_z^b(y)e^{-ik_\sigma x})}{1 - e^{-ik_\sigma X}} + \frac{ik_\sigma(J_z^l(x)e^{-ik_\sigma y} + J_z^r(x)e^{-ik_\sigma(Y-y)})}{1 - e^{-ik_\sigma Y}} \quad (5)$$

where $J_z^t(y)$, $J_z^b(y)$, $J_z^l(x)$, $J_z^r(x)$ are the unknown surface current densities at the points of radius-vector P projections onto the top, bottom, left, and right walls of the conductor, respectively as shown in FIG. 1(a). In Equation (5) $k_\sigma = \sqrt{\omega\mu_0\sigma/2}(1-i)$ is the complex wavenumber of the conductor V material, while X and Y denote the cross-sectional thickness and width, respectively. Substitution of formula (5) into volumetric EFIE (4) and ignoring variation of the Green's function along the coordinate normal to the conductor's periphery yields:

$$\int_S G(\rho \mid \rho')j_z(\rho')dS' \cong \quad (6)$$
$$\int_{C^t} G(\rho \mid X, y')J_z^t(y')dy' + \int_{C^b} G(\rho \mid 0, y')J_z^b(y')dy' + \int_{C^l} G(\rho \mid x', 0)J_z^l(x')dx' + \int_{C^r} G(\rho \mid x', Y)J_z^r(x')dx'$$

Note that ignoring Green's function variation along the normal to the conductor surface is optional. Instead, one may choose to include effect of Green's function variation by performing integration along this coordinate numerically to given precision.

Restriction of the observation point $\rho$ to the conductor periphery C in equation (4) together with the approximation in equation (6) reduces the volumetric EFIE (4) to the surface EFIE with respect to the unknown surface current density $J_z(\rho')$ as follows:

$$Z^\sigma\{J_z(\rho)\} + i\omega\mu_0 \int_C G(\rho \mid \rho')J_z(\rho')dc' = -V_{p.u.l.}(\rho) \quad (7)$$

where the radius-vectors $\rho$ and $\rho'$ reside on the conductor surface $C=\partial S$, C being the union of the top, bottom, left, and right conductor sides $C^t$, $C^b$, $C^l$, and $C^r$ respectively.

In EFIE (7) $Z^\sigma\{J_z(\rho)\}$ denotes the surface impedance operator relating z-directed electric field on the surface of conductor $E_z(\rho)$ to the values of the surface current densities $J_z(\rho)$ at the corresponding points on the top, bottom, left, and right sides of the conductor (FIG. 1a) according to Ohm's law and the approximation in equation (5).

$$Z^\sigma\{J_z(\rho)\} = [E_z^t(y), E_z^b(y), E_z^l(x), E_z^r(x)]^T = \quad (8)$$
$$\frac{ik_\sigma}{\sigma} \times \begin{bmatrix} \frac{1}{1-e^{-ik_\sigma X}} & \frac{e^{-ik_\sigma X}}{1-e^{-ik_\sigma X}} & \frac{e^{-ik_\sigma y}}{1-e^{-ik_\sigma Y}} & \frac{e^{-ik_\sigma(Y-y)}}{1-e^{-ik_\sigma Y}} \\ \frac{e^{-ik_\sigma X}}{1-e^{-ik_\sigma X}} & \frac{1}{1-e^{-ik_\sigma X}} & \frac{e^{-ik_\sigma y}}{1-e^{-ik_\sigma Y}} & \frac{e^{-ik_\sigma(Y-y)}}{1-e^{-ik_\sigma Y}} \\ \frac{e^{-ik_\sigma(X-x)}}{1-e^{-ik_\sigma X}} & \frac{e^{-ik_\sigma x}}{1-e^{-ik_\sigma X}} & \frac{1}{1-e^{-ik_\sigma Y}} & \frac{e^{-ik_\sigma Y}}{1-e^{-ik_\sigma Y}} \\ \frac{e^{-ik_\sigma(X-x)}}{1-e^{-ik_\sigma X}} & \frac{e^{-ik_\sigma x}}{1-e^{-ik_\sigma X}} & \frac{e^{-ik_\sigma Y}}{1-e^{-ik_\sigma Y}} & \frac{1}{1-e^{-ik_\sigma Y}} \end{bmatrix}$$
$$\cdot [J_z^t(y), J_z^b(y), J_z^l(x), J_z^r(x)]^T.$$

The operator behavior at dc is examined via taking the limit of equation (8) as it approaches zero. Using Taylor approximation for very small exponential arguments, i.e. $e^a \cong a+1$, $$\lim_{\omega \to 0} Z^\sigma\{J_z(\rho)\} = \begin{bmatrix} 1/\sigma X & 1/\sigma X & 1/\sigma Y & 1/\sigma Y \\ 1/\sigma X & 1/\sigma X & 1/\sigma Y & 1/\sigma Y \\ 1/\sigma X & 1/\sigma X & 1/\sigma Y & 1/\sigma Y \\ 1/\sigma X & 1/\sigma X & 1/\sigma Y & 1/\sigma Y \end{bmatrix} \cdot \begin{bmatrix} J_z^t(y) \\ J_z^b(y) \\ J_z^l(x) \\ J_z^r(x) \end{bmatrix} \quad (9)$$

which indicates the dc resistance seen by the four surface current densities on the conductor's periphery. At high frequencies, the exponential terms of the operator become negligible, thus, turning the operator's off-diagonal elements to zero whereas the diagonal terms tend to $(1+i)\sqrt{\omega\mu_0/2\sigma}$, which corresponds to the local surface impedance of the half-space with conductivity $\sigma$. From equation (8) it is also observed that $\lim_{\sigma \to +\infty} Z^\sigma\{J_z(\rho)\}=0$, which implies that equation (7) becomes an EFIE for a perfectly conducting interconnect.

Implementation of Method of Moments

The proposed surface impedance model is intended for use in conjunction with an appropriate MoM discretization scheme. Below we demonstrate the MoM implementation with N=14 piece-wise basis functions distributed over the conductor periphery as shown in FIG. 1(b). Under the above discretization the surface EFIE (7) is reduced to the linear algebraic equations as follows:

$$(Z^\sigma + Z^A) \cdot J = V \quad (10)$$

where $Z_{mn}^A = i\omega\mu_0 \int_{\Delta C_n} G(\rho_m|\rho')dc'$ is the dense matrix of the vector potential interactions, $V_m = -V_{p.u.l.}(\rho_m)$ is the vector of excitation, $J_m = J_z(\rho_m)$ is the vector of unknown current densities on the conductor's periphery, and $Z_{mn}^\sigma$ is the sparse matrix corresponding to the surface impedance operator in equation (8). Indexes m and n in the above matrices run from 1 to N. The non-zero elements in the sparse matrix $Z^\sigma$ for this particular discretization are shown in FIG. 1(c) with the patterned squares. The black squares in FIG. 1(c) depict the non-zero entries in $Z^\sigma$ corresponding to the field $E_z$ tested at the observation point $\rho = \hat{x}X + \hat{y}y_3$ situated in the middle of the 3rd element on the top peripheral segment $C^t$. In accord with equation (8), this field is related to the surface current density on the top, bottom and side walls as $$E_z^t(y_3) = Z_{3,3}^{\sigma,tt} J_z^t(y_3) + Z_{3,3}^{\sigma,tb} J_z^b(y_3) + Z_{3,1}^{\sigma,tl} J_z^l(x_1) + Z_{3,1}^{\sigma,tr} J_z^r(x_1) \quad (11)$$

where the matrix $Z^\sigma$ entries are $$Z_{3,3}^{\sigma,tt} = \frac{ik_\sigma}{\sigma} \frac{1}{1 - e^{-ik_\sigma X}}, \quad Z_{3,3}^{\sigma,tb} = \frac{ik_\sigma}{\sigma} \frac{e^{-ik_\sigma X}}{1 - e^{-ik_\sigma X}}, \quad (12)$$

$$Z_{3,1}^{\sigma,tl} = \frac{ik_\sigma}{\sigma} \frac{e^{-ik_\sigma y_3}}{1 - e^{-ik_\sigma Y}}, \quad Z_{3,1}^{\sigma,tr} = \frac{ik_\sigma}{\sigma} \frac{e^{-ik_\sigma(Y-y_3)}}{1 - e^{-ik_\sigma Y}}.$$

The remaining non-zero element in the surface impedance matrix $Z^\sigma$ are filled out in a similar manner.

Numerical Results

The proposed full-peripheral surface impedance model has been tested for several interconnects with both large and small thickness/width ratios and has shown a reliable performance. A detailed description of p.u.l. resistance and inductance matrices for k conductor system can be found in C. R. Paul, *Analysis of Mulliconduclor Transmission Lines*, Ch. 3, John Wiley & Sons, Inc., Toronto, CA, 1994.

Figure 2:
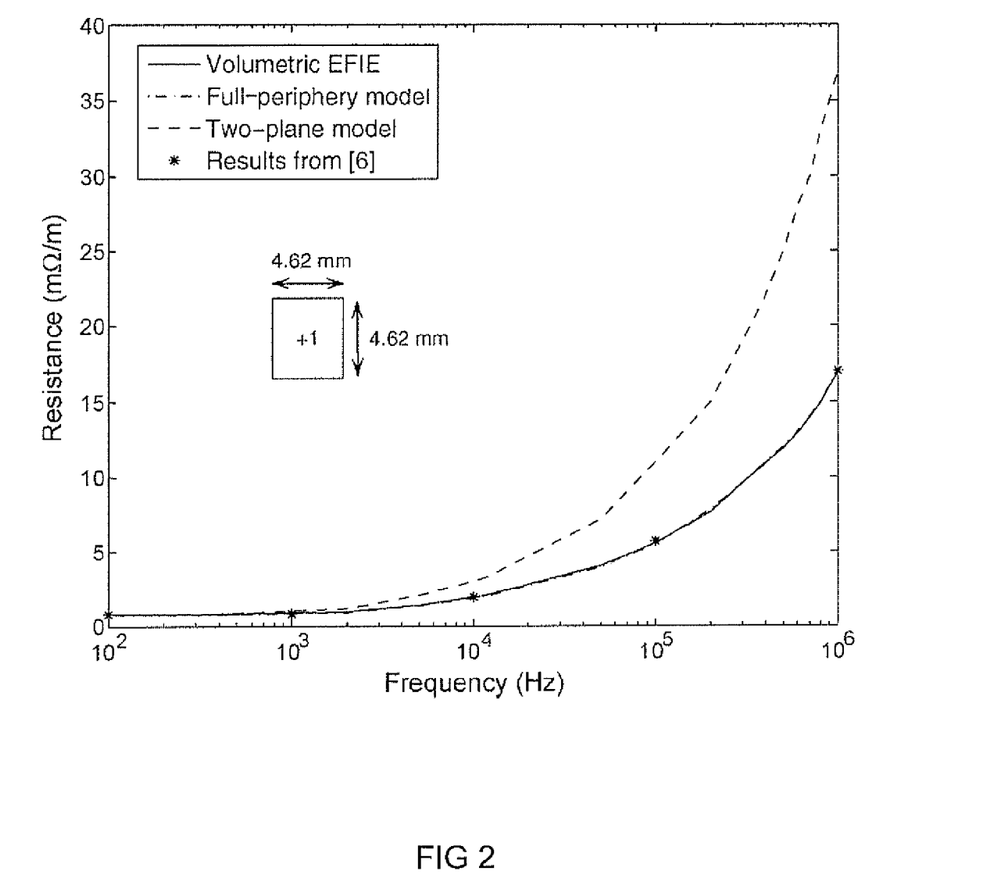
FIG. 2 illustrates graphical representations of inductance and resistance computations relative to frequency for an isolated square signal line with σ=57.2 MS/m.

In the first numerical experiment, the p.u.l. resistance and inductance are extracted for the 4.62 mm-wide copper wire of square cross-section represented in FIG. 2 via the solution of EFIE (7) with surface impedance equation (8). The extracted parameters are compared to the accurate volumetric EFIE solution equation (4) as well as to the extracted p.u.l. resistance presented in D. DeZutter, et al., "Skin Effect Modeling Based on a Differential Surface Admittance Operator," *IEEE Trans. Microwave Theory Tech.*, vol. 53, no. 8, pp. 2526-2538, August. 2005. The MoM discretization at all frequencies consisted of 20 equidistant segments per each side of the conductor. The results from the two-plane surface impedance model utilized in the 2.5D interconnect models, as described in J. D. Morsey, et. al., "Finite-Thickness Conductor Models for Full-Wave Analysis of Interconnects With a Fast Integral Equation Method," *IEEE Trans. on Advanced Packaging*, vol. 27, no. 1, pp. 24-33, February 2004, are also shown in FIG. 2. The error in the latter increases at high frequencies because only the top and bottom segments of the conductor's periphery support the current. Such model becomes inaccurate when the thickness of conductor is comparable to its width. The EM analysis yielded a dc resistance of 0.8191 mΩ/m and the $\sqrt{f}$ resistance dependence at high frequency is apparent from FIG. 2. The p.u.l. inductance is undefined under this scenario.

Figure 3:
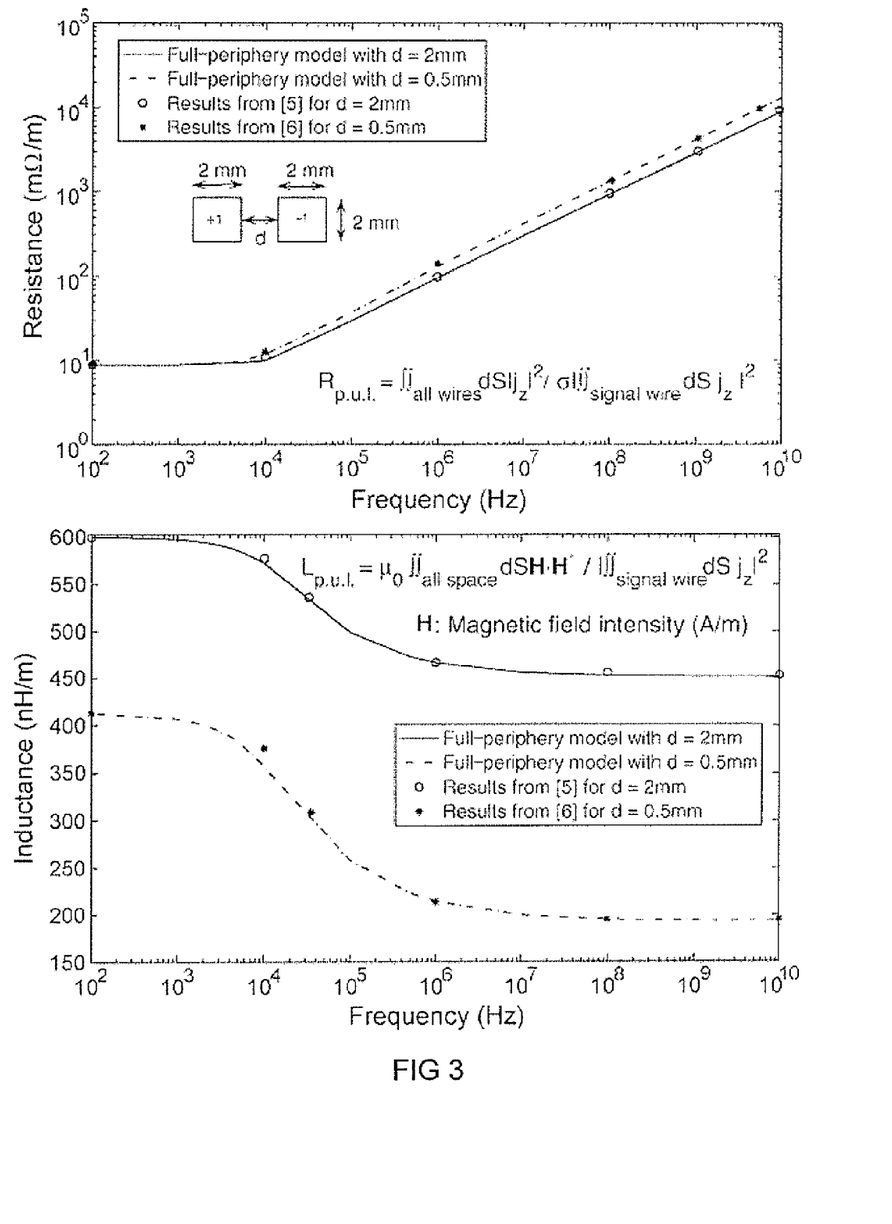
FIG. 3 illustrates graphical representations of inductance and resistance computations relative to frequency for a differential line pair of conductors with σ=56 MS/m.

The example in FIG. 3 demonstrates the accuracy of the new model in the presence of proximity effects. The p.u.l. resistance and inductance are extracted for a differential line pair made of two copper wires featuring 2 mm square cross-section and various separation distances d. FIG. 3 depicts the extracted resistance and inductance of the configuration as a function of frequency. The results obtained using the proposed model are compared with those published in C. R. Paul, *Analysis of Mulliconduclor Transmission Lines*, Ch. 3, John Wiley & Sons, Inc., Toronto, CA, 1994 and D. DeZutter, et al., "Skin Effect Modeling Based on a Differential Surface Admittance Operator," IEEE Trans. Microwave Theory Tech., vol. 53, no. 8, pp. 2526-2538, August. 2005. The full-periphery EFIE solver yields dc resistance (independent from d as expected) of 8.929 mΩ/m, which agrees with the dc resistance value in C. R. Paul, *Analysis of Mulliconduclor Transmission Lines*, Ch. 3, John Wiley & Sons, Inc., Toronto, CA, 1994. The dc inductance was computed to be 600.6 nH/m (599.5 nH/m in C. R. Paul, *Analysis of Mulliconductor Transmission Lines*, Ch. 3, John Wiley & Sons, Inc., Toronto, CA, 1994) for d=2 mm and 412.6 nH/m (413 nH/m in D. DeZutter, et al., "Skin Effect Modeling Based on a Differential Surface Admittance Operator," *IEEE Trans. Microwave Theory Tech.*, vol. 53, no. 8, pp. 2526-2538, August. 2005) for d=0.5 mm.

Attention is now drawn to full-peripheral impedance for skin effect approximation in a three-dimensional electric field integral equation.

Surface Electric Field Integral Equation And Conductor Loss Model

Figure 4:
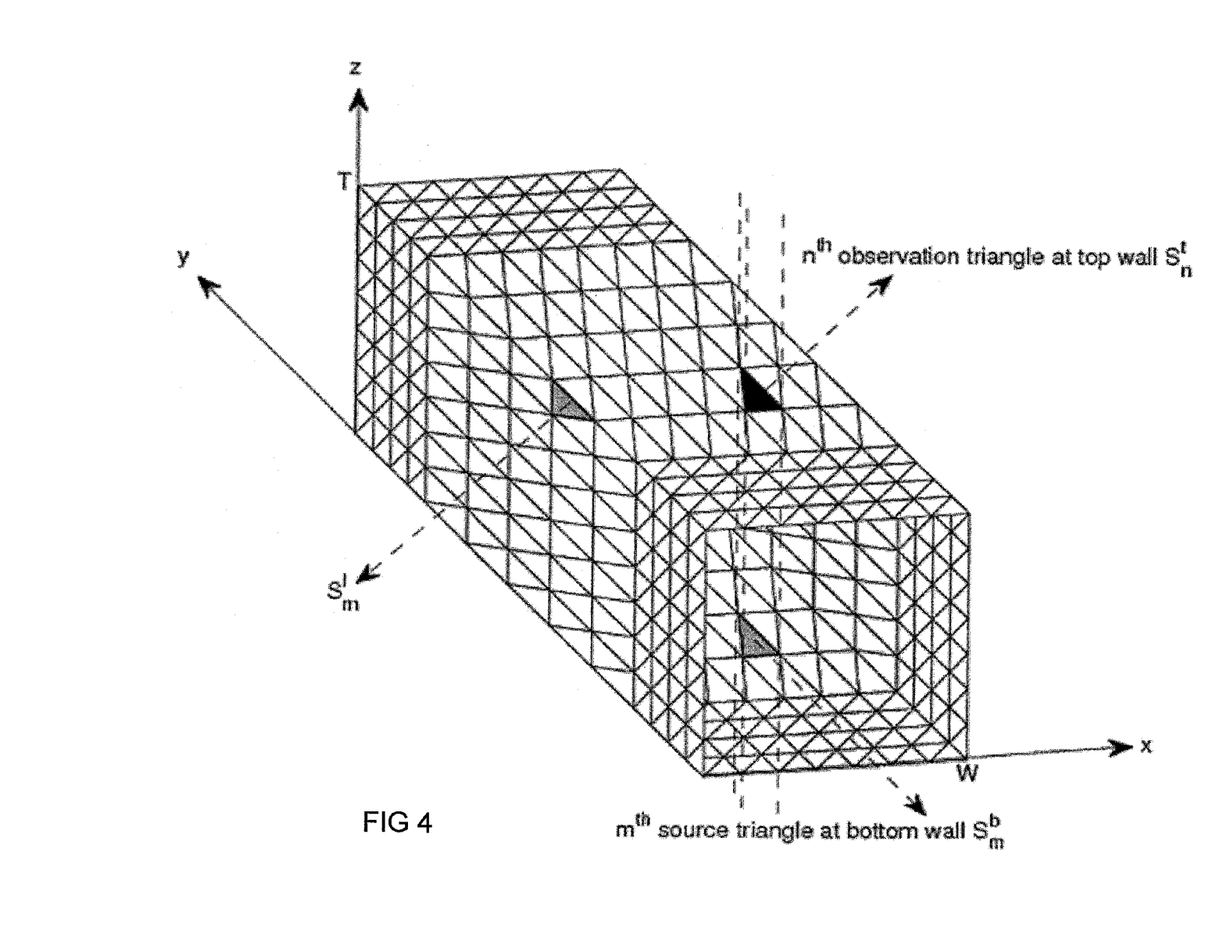
FIG. 4 is a schematic representation of exemplary source triangles on the left, top, and bottom walls yielding non-zero ramp function to ramp function interactions with an observation triangle on the top wall in the discretize surface impedance operator.

Let us consider a generic planar interconnect structure, depicted in FIG. 4, occupying volume V in the medium of L homogeneous dielectric layers, which are infinitely extending in the xy-plane and exhibit inhomogeneity along the z-axis. The interconnect is made up of a very good conducting material where conduction current is dominant and displacement current is negligible. The layers are characterized by complex permittivity $\hat{\epsilon}_l = \epsilon_l + \sigma_l/(j\omega\epsilon_l)$ and permeability $\mu_l$ within intervals $h_l < z < h_{l+1}$ where $l = 1, \ldots, L$ and $i = \sqrt{-1}$. In the above and throughout the following derivations the time-harmonic field variation is assumed and suppressed for brevity. The electric field in a multilayered medium is related to volumetric electric current density j through the vector potential A as $$E(r) = E^{inc}(r) - \left(i\omega + \frac{1}{i\omega\hat{\epsilon}\mu}\nabla\nabla\cdot\right)A(r). \quad (13)$$

where $$A(r) = \int_V \overline{G}_A(r, r') \cdot j(r')dv'. \quad (14)$$

In above noted equation (14), $\overline{G}_A$ is the layered medium Greens function in standard form $$\overline{G}_A = \hat{x}\hat{x}G_{A,xx} + \hat{y}\hat{y}G_{A,xx} + \hat{z}\hat{z}G_{A,zz} + \hat{z}\hat{x}G_{A,zx} + \hat{z}\hat{y}G_{A,zx}. \quad (15)$$

The electric field integral equation (EFIE) with respect to current j flowing in the conductor due to given excitation $E^{inc}$ follows from Ohm's law $E(r) = \sigma^{-1}j(r)$ enforced inside the conductor $$\sigma^{-1}j(r) = E^{inc}(r) - \left(i\omega + \frac{1}{i\omega\hat{\epsilon}\mu}\nabla\nabla\cdot\right)\int_V \overline{G}_A(r, r') \cdot j(r')dv', r \in V. \quad (16)$$

Numerical solution of the volumetric integral equation (14) may be time consuming. Therefore, we use the surface impedance approximation to reduce the volumetric EFIE to the surface integral equation. Considering the rectangular cross-section of the conductors with local coordinate system introduced as shown in FIG. 4 we approximate dependence of the volumetric current density j across the thickness of the conductor according to the skin-effect $$j(r) \cong \frac{ik_\sigma(J(r^t)e^{-ik_\sigma(T-z(r))} + J(r^b)e^{-ik_\sigma z(r)})}{1 - e^{-ik_\sigma T}} + \frac{ik_\sigma(J(r^l)e^{-ik_\sigma(x(r))} + J(r^r)e^{-ik_\sigma(X-x(r))})}{1 - e^{-ik_\sigma W}} \quad (17)$$

where $J(r^t)$, $J(r^b)$, $J(r^l)$, $J(r^r)$ are the surface current densities the projection of radius-vector r the top, bottom, left, and right walls of the conductor, respectively, $k_\sigma = \sqrt{\omega\mu_0/2}(1-i)$ is the wavenumber of conductor. In equation (17) the conductor's thickness and its width at location r are denoted as T and W, respectively. On substitution of formula (17) into the integral equation we obtain $$\int_V \overline{G}_A(r, r') \cdot j(r') dv' \cong \quad (18)$$

$$\int_{S^t} \int_{z'=0}^{T} \overline{G}_A(r, r' - \hat{n}(r')z') \cdot \frac{J(r')e^{-ik_\sigma z'} ik_\sigma}{1 - e^{-ik_\sigma T}} dz' ds' +$$

$$\int_{S^b} \int_{z'=0}^{T} \overline{G}_A(r, r' + \hat{n}(r')z') \cdot \frac{J(r')e^{-ik_\sigma z'} ik_\sigma}{1 - e^{-ik_\sigma T}} dz' ds' +$$

$$\int_{S^l} \int_{x'=0}^{W} \overline{G}_A(r, r' + \hat{n}(r')x') \cdot \frac{J(r')e^{-ik_\sigma x'} ik_\sigma}{1 - e^{-ik_\sigma W}} dx' ds' +$$

$$\int_{S^r} \int_{x'=0}^{W} \overline{G}_A(r, r' - \hat{n}(r')x') \cdot \frac{J(r')e^{-ik_\sigma x'} ik_\sigma}{1 - e^{-ik_\sigma W}} dx' ds'.$$

where the source radius-vector r' resides on the conductor surface S, i.e. r'∈S, S being the union of the top, bottom, left, and right conductor walls $S^t$, $S^b$, $S^l$, and $S^r$ respectively. Assuming small thickness of conductor we can ignore the variation of the Green's function across the conductor cross-section $\overline{G}_A(r,r'\pm\hat{n}(r')z')\cong\overline{G}_A(r,r')$ and $\overline{G}_A(r,r'\pm\hat{n}(r')x')\cong\overline{G}_A(r,r')$ in equation (18). Such approximation allows us to evaluate analytically the integrals over conductor thickness T and width W in equation (18) and combine the four integral terms over the top, bottom, left, and right surfaces, yielding $$\int_V \overline{G}_A(r, r') \cdot j(r') dv' \cong \int_S \overline{G}_A(r, r') \cdot J(r') ds'. \quad (19)$$

Thus, instead of the volume integral equation (16) we obtain the surface integral equation with respect to the unknown surface current densities $$Z^s\{J(r')\} = \quad (20)$$

$$\hat{n}(r) \times \left[E^{inc}(r) - \left(i\omega + \frac{1}{i\omega\hat{\epsilon}\mu}\nabla\nabla\cdot\right)\int_S \overline{G}_A(r, r') \cdot J(r') ds'\right], r, r' \in S.$$

In equation (20) $Z^s\{J(r')\}$ denotes the surface impedance operator relating tangential electric field on the surface of conductor to the values of the surface current densities J(r') at the corresponding points on the top, bottom, left, and right sides of the conductor according to $E(r)=\sigma^{-1}j(r)$ and the rela-tionship in equation (17) between the volumetric and surface current densities $$\hat{n}(r) \times E(r) = Z^s\{J(r')\} \quad (21)$$

$$= [E(r \in S^t), E(r \in S^b), E(r \in S^l), E(r \in S^r)]^{t_p}$$

$$= \frac{ik_\sigma}{\sigma} \times$$

$$\begin{bmatrix} \frac{1}{1-e^{-ik_\sigma T}} & \frac{e^{-ik_\sigma T}}{1-e^{-ik_\sigma T}} & \frac{e^{-ik_\sigma x}}{1-e^{-ik_\sigma W}} & \frac{e^{-ik_\sigma(W-x)}}{1-e^{-ik_\sigma W}} \\ \frac{e^{-ik_\sigma T}}{1-e^{-ik_\sigma T}} & \frac{1}{1-e^{-ik_\sigma T}} & \frac{e^{-ik_\sigma x}}{1-e^{-ik_\sigma W}} & \frac{e^{-ik_\sigma(W-x)}}{1-e^{-ik_\sigma W}} \\ \frac{e^{-ik_\sigma(T-z)}}{1-e^{-ik_\sigma T}} & \frac{e^{-ik_\sigma z}}{1-e^{-ik_\sigma T}} & \frac{1}{1-e^{-ik_\sigma W}} & \frac{e^{-ik_\sigma W}}{1-e^{-ik_\sigma W}} \\ \frac{e^{-ik_\sigma(T-z)}}{1-e^{-ik_\sigma T}} & \frac{e^{-ik_\sigma z}}{1-e^{-ik_\sigma T}} & \frac{e^{-ik_\sigma W}}{1-e^{-ik_\sigma W}} & \frac{1}{1-e^{-ik_\sigma W}} \end{bmatrix}.$$

$$\begin{bmatrix} J(r'(r) \in S^t) \\ J(r'(r) \in S^b) \\ J(r'(r) \in S^l) \\ J(r'(r) \in S^r) \end{bmatrix}$$

Superscript $t_p$ in formula (21) denotes transposition.

Method of Moments Discretization of the Surface Impedance Operator

In order to make surface EFIE (8) amenable to Rao-Wilton-Glission (RWG) solution (as per S. M. Rao, D. R. Wilton, and A. W. Glisson, "Electromagnetic scattering by surfaces of arbitrary shapes," *IEEE Trans. Antennas Propag.*, Vol. 30, pp. 409-418, May 1982 and K. A. Michalski and D. Zheng, "Electromagnetic scattering and radiation by surfaces of arbitrary shape in layered media, Part I: Theory," *IEEE Trans. Antennas Propag.*, Vol. 38, pp. 335-344, March 1990) the interconnect surface is modeled by a triangulated plane extruded to its corresponding thickness (FIG. 4). The discussion of the full periphery surface impedance operator RWG discretization is detailed below. Considering a single conductor the traditional RWG discretization of the unknown current J in (20) over N basis functions $f$ is equivalently formulated as a discretization over the ramp-functions (half-RWG functions) situated at the top, bottom, left, and right walls of conductor as follows $$J(r) \cong \sum_{j=1}^{N} J_j f_j(r) = \sum_{w=t,b,l,r} \sum_{m=1}^{M^w} \sum_{j=1}^{3} I_{j,m}^w R_{j,m}^w(r). \quad (22)$$

where index W denotes which wall the $m^{th}$ triangle supporting ramp $R_{j,m}^w$ is situated on and index j runs over three ramps on each triangle in according with FIG. 4.

Figure 5:
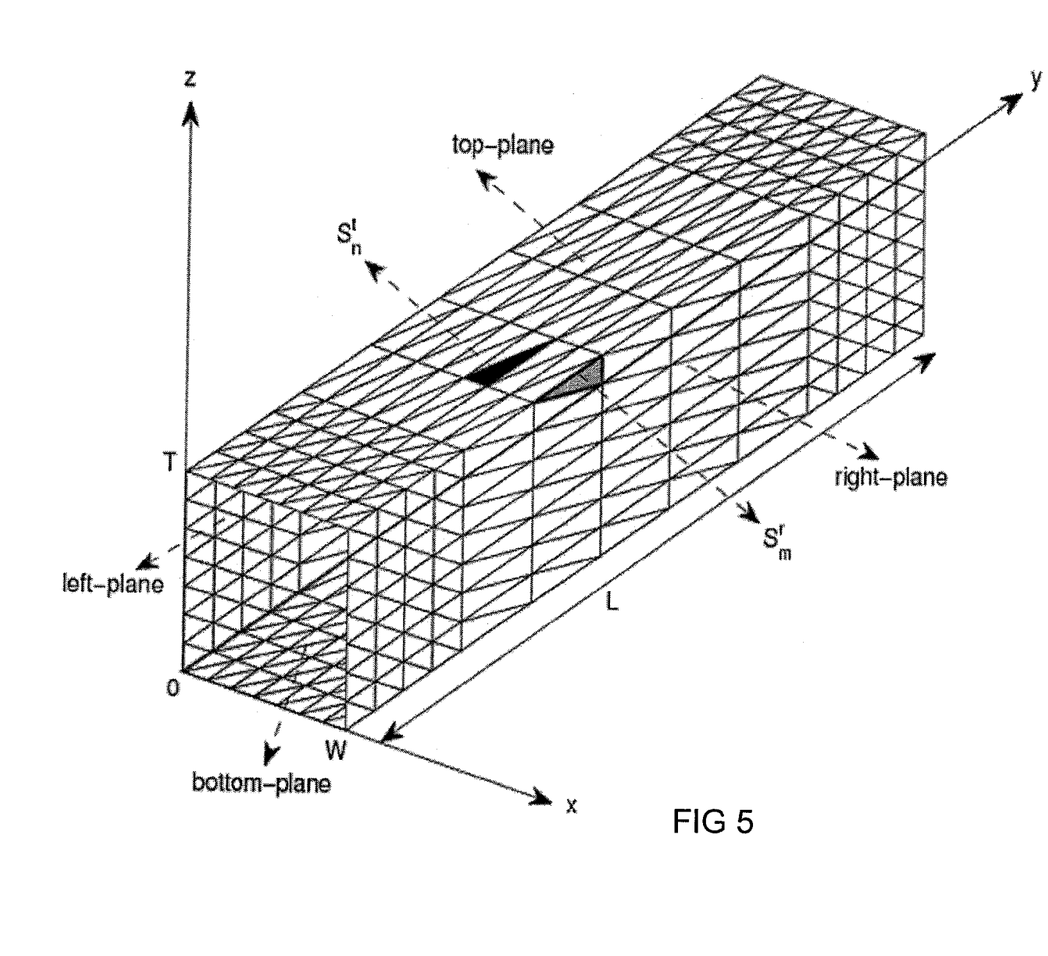
FIG. 5 is a schematic representation of an example of an mth source triangle on the right wall and mth observation triangle on the top-wall yielding non-zero ramp function to ramp function interactions in the discretize surface impedance operator.

The ramp-function discretization equation (22) of the unknown current J under the surface impedance operator $Z^s$ in equation (20) followed by testing of the resultant electric field $Z^s\{J\}$ with ramp-function $R_{i,n}^t$ in of top-wall triangle $S_n^t$ yields $$\langle R_{i,n}^t(r), Z^s\{J\}\rangle = \langle R_{i,n}^t(r), Z_{tt}^s J(r_m^t(r)) + Z_{t,b}^s J(r_m^b(r)) +$$
$$Z_{tl}^s(r))J(r_m^l(r)) + Z_{tr}^s J(r_m^r(r))\rangle \quad (23)$$

where $J(r_m^t)$, $J(r_m^b)$, $J(r_m^l)$, $J(r_m^r)$, are the current values at the corresponding points $r_m^t$, $r_m^b$, $r_m^l$, $r_m^r$, source triangles $S_m^t$, $S_m^b$, $S_m^l$, $S_m^r$ at the top, bottom, left, and right walls, respectively, overlapping with triangle $S_n^t$ as shown in FIG. 4 and FIG. 5. The current values on each source triangle are defined as a superposition of three ramp-functions $$J(r_m^t) = \sum_{j=1}^{3} I_{j,m}^t R_{j,m}^t(r_m^t), \quad (24)$$

$$J(r_m^b) = \sum_{j=1}^{3} I_{j,m}^b R_{j,m}^b(r_m^b)$$

$$J(r_m^l) = \sum_{j=1}^{3} I_{j,m}^l R_{j,m}^l(r_m^l),$$

$$J(r_m^r) = \sum_{j=1}^{3} I_{j,m}^r R_{j,m}^r(r_m^r),$$

and the corresponding values of the surface impedance operator are $$Z_{tt}^s = \frac{ik_\sigma}{\sigma} \frac{1}{1-e^{-ik_\sigma T}}, \quad Z_{tb}^s = \frac{ik_\sigma}{\sigma} \frac{e^{-ik_\sigma T}}{1-e^{-ik_\sigma T}}, \quad (25)$$

$$Z_{tl}^s = \frac{ik_\sigma}{\sigma} \frac{e^{-ik_\sigma x}}{1-e^{-ik_\sigma W}}, \quad Z_{tr}^s(r) = \frac{ik_\sigma}{\sigma} \frac{e^{-ik_\sigma (W-x)}}{1-e^{-ik_\sigma W}}.$$

In equation (24) $I_{j,m}^w$, w=t, b, l, r represent the sought unknown coefficients in method of moments. From equations (23) through (25) we notice that each, ith ramp $R_{i,n}^t$ on nth top wall, the observation triangle $S_n^t$ has non-zero inner products $\langle R_{i,n}^t, R_{j,m}^w \rangle$ with each of three ramps $R_{j,m}^w$, j=1, 2, 3, on overlapping triangles $S_m^w$, w=t, b, l, r thus, yielding the following 12 nonzero entries in each row of the discretized surface impedance operator $$I_{j,m}^t Z_{tt}^s \langle R_{i,n}^t(r), R_{j,m}^t(r_m^t(r)) \rangle = \quad (26)$$
$$I_{j,m}^t \frac{ik_\sigma}{\sigma} \frac{1}{1-e^{-ik_\sigma T}} \int_{S_n^t} R_{i,n}^t(r) \cdot R_{j,m}^t(r_m^t(r)) dS$$

$$I_{j,m}^b Z_{tb}^s \langle R_{i,n}^t(r), R_{j,m}^b(r_m^b(r)) \rangle = \quad (27)$$
$$I_{j,m}^b \frac{ik_\sigma}{\sigma} \frac{e^{-ik_\sigma T}}{1-e^{-ik_\sigma T}} \int_{S_n^t} R_{i,n}^t(r) \cdot R_{j,m}^b(r_m^b(r)) dS$$

$$I_{j,m}^l \langle R_{i,n}^t(r), Z_{tl}^s(r) R_{j,m}^l(r_m^l(r)) \rangle = \quad (28)$$
$$I_{j,m}^l \frac{ik_\sigma}{\sigma} \frac{1}{1-e^{-ik_\sigma W}} \int_{S_n^t} R_{i,n}^t(r) \cdot R_{j,m}^l(r_m^l(r)) e^{-ik_\sigma x} dS$$

$$I_{j,m}^r \langle R_{i,n}^t(r), Z_{tr}^s(r) R_{j,m}^r(r_m^r(r)) \rangle = \quad (29)$$
$$I_{j,m}^r \frac{ik_\sigma}{\sigma} \frac{1}{1-e^{-ik_\sigma W}} \int_{S_n^t} R_{i,n}^t(r) \cdot R_{j,m}^r(r_m^r(r)) e^{-ik_\sigma (W-x)} dS$$

The integrals in equations (26) through (29) can be evaluated numerically to arbitrary precision.

Since various modifications can be made in my invention as herein above described, and many apparently widely different embodiments of same made within the spirit and scope of the claims without department from such spirit and scope, it is intended that all matter contained in the accompanying specification shall be interpreted as illustrative only and not in a limiting sense.

The invention claimed is:

1. A method of modeling surface impedance of an interconnect conductor of an integrated circuit design in which the conductor has a current flow in a z-direction, the method comprising:

formulating a volumetric electric field integral equation with respect to an unknown volumetric current density $j_z$ of the current flow in a cross-section of the conductor due to a vector of excitation $V_{p.u.l.}$ by enforcing Ohm's law $E_z(\rho) = \sigma^- j_z(\rho)$ inside the conductor ($\rho \in S$) as follows:

$$\sigma^{-1} j_z(\rho) + i\omega\mu_0 \int_S G(\rho \mid \rho') j_z(\rho') dS' = -V_{p.u.l.}(\rho);$$

representing the unknown volumetric current density in the volumetric electric field integral equation as a product of a current density of a peripheral surface of the conductor and an exponential factor describing a cross-sectional distribution of the current flow according to skin effect by approximating the unknown volumetric current density, represented as $j_z$, across the conductor according to skin-effect of a plane-wave incident on a conducting plane with infinite extension as follows:

$$j_z(\rho) \cong$$

$$\frac{ik_\sigma (J_z^t(y) e^{-ik_\sigma(X-x)} + J_z^b(y) e^{-ik_\sigma x})}{1-e^{-ik_\sigma X}} + \frac{ik_\sigma (J_z^l(x) e^{-ik_\sigma y} + J_z^r(x) e^{-ik_\sigma(Y-y)})}{1-e^{-ik_\sigma Y}}$$

where $J_z^t(y)$, $J_z^b(y)$, $J_z^l(x)$, $J_z^r(x)$ are unknown surface current densities at points of radius-vector $\rho$ projections onto respective top, bottom, left, and right walls of the conductor;

adopting an approximation of Green's function across a cross-section of the conductor; and reducing the volumetric electric field integral equation including the unknown volumetric current density representation to a surface integral equation using the approximation of Green's function, resulting in a surface impedance model; and applying the surface impedance model to the integrated circuit design.

2. The method according to claim 1 including adopting an approximation of Green's function by fixing Green's function across the cross-section of the conductor.

3. The method according to claim 1 for a conductor having a rectangular cross-section.

4. The method according to claim 1 including:

reducing the volumetric electric field integral equation to a surface electric field integral equation with respect to the current density of the peripheral surface of the conductor by restricting an observation point $\rho$ to a periphery of the conductor as follows:

$$Z^\sigma \{J_z(\rho)\} + i\omega\mu_0 \int_C G(\rho \mid \rho') J_z(\rho') dc' = -V_{p.u.l.}(\rho);$$

and combining unknown surface current densities over the top, bottom, left and right sides and evaluating integrals thereof over a conductor thickness T and conductor width W as follows:

$$\int_V \overline{G}_A(r, r') \cdot j(r') dv' \cong \int_S \overline{G}_A(r, r') \cdot J(r') ds'.$$

5. The method according to claim 1 for a conductor having a non-rectangular polygonal cross-section.

6. The method according to claim 1 including formulating the volumetric electric field integral equation with respect to the unknown volumetric current density of the current flow in the conductor for current flows along more than one axis.

7. The method according to claim 1 including formulating the volumetric electric field integral equation with respect to the unknown volumetric current density of the current flow in the conductor for three dimensional current flows.

8. The method according to claim 1 including relating the unknown volumetric current density to unknown surface current densities for each surface of the conductor in which each unknown surface current density is represented as a multidimensional vector.

9. The method according to claim 1 including reducing the volumetric electric field integral equation to the surface integral equation in which a tangential electrical field at any point on a surface of the conductor is related to a surface current density at corresponding points on all segments of a cross-sectional periphery of the conductor.

10. The method according to claim 1 including reducing the volumetric electric field integral equation to the surface integral equation in which a tangential electrical field at any point on a surface of the conductor is related to a tangential magnetic field at corresponding points on all segments of a cross-sectional periphery of the conductor.

11. A method of applying a surface impedance model to a conductor of an integrated circuit design, the method comprising:
providing a surface impedance model comprising a surface electric field integral equation including a surface impedance term and an integral term resulting from a reduction of a volumetric electric field integral equation in which an unknown cross-sectional volumetric current of the volumetric electric field integral equation is approximated as a product of an exponential factor describing a cross-sectional distribution of the current according to skin effect and a current density on a peripheral surface of the conductor of said integrated circuit design;
discretizing the surface electric field integral equation of a periphery of the conductor of said integrated circuit design into a discrete form comprising a sum of a sparse matrix corresponding to the surface impedance term of the surface electric field integral equation and a dense matrix corresponding to the integral term of the surface electric field integral equation; and
identifying for each discrete element of the discrete form, other discrete elements which are related via the surface impedance model.

12. The method according to claim 11 including using the surface impedance model in conjunction with a method of moment discretization scheme.

13. The method according to claim 11 wherein the surface impedance model comprises Green's function being fixed across the cross-section of the conductor.

14. The method according to claim 11 for conductor having a rectangular cross-section.

15. The method according to claim 11 for a conductor having a non-rectangular polygonal cross-section.

16. The method according to claim 11 wherein the surface impedance model comprises the unknown cross-sectional volumetric current of the volumetric electric field integral equation being approximated for current flows along more than one axis.

17. The method according to claim 11 wherein the surface impedance model comprises the volumetric electric field integral equation being approximated for three dimensional current flows.

18. The method according to claim 11 wherein the surface impedance model comprises the unknown volumetric current density being related to unknown surface current densities represented as multidimensional vectors for each surface of the conductor.

19. The method according to claim 11 wherein the surface impedance model comprises a tangential electrical field at any point on a surface of the conductor being related to a surface current density at corresponding points on all segments of a cross-sectional periphery of the conductor.

20. The method according to claim 11 wherein the surface impedance model comprises a tangential electrical field at any point on a surface of the conductor being related to a tangential magnetic field at corresponding points on all segments of a cross-sectional periphery of the conductor.

21. The method according to claim 11 including representing the dense matrix as follows:

$$Z_{mn} = i\omega\mu_0 \int_{\Delta C_n} G(\rho_m|\rho') dc'.$$

* * * * *